United States Patent [19]

Dolland

[11] Patent Number: 4,631,474

[45] Date of Patent: Dec. 23, 1986

[54] HIGH OR LOW-SIDE STATE RELAY WITH CURRENT LIMITING AND OPERATIONAL TESTING

[75] Inventor: Carlisle R. Dolland, Torrance, Calif.

[73] Assignee: The United States of America as represented by the Secretary of the Air Force, Washington, D.C.

[21] Appl. No.: 629,862

[22] Filed: Jul. 11, 1984

[51] Int. Cl.⁴ .................... G01R 31/02; H03K 17/687
[52] U.S. Cl. .................................. 324/73 R; 307/584
[58] Field of Search ....................... 324/73 R, 110, 133; 340/644, 654; 307/571, 584, 290

[56] References Cited

U.S. PATENT DOCUMENTS

| | | | |
|---|---|---|---|
| 3,131,314 | 4/1964 | Charlot, Jr. | 307/290 |
| 3,148,357 | 9/1964 | Thornton | 340/174 |
| 3,610,953 | 10/1971 | Gordon et al. | 307/230 |
| 3,720,848 | 3/1973 | Schmidt, Jr. | 307/251 |
| 3,789,244 | 1/1974 | Provansano | 307/251 |
| 3,984,703 | 10/1976 | Jorgensen | 307/279 |
| 4,095,213 | 6/1978 | Hayden | 340/644 |
| 4,188,547 | 2/1980 | Fox | 307/239 |
| 4,274,014 | 6/1981 | Schade, Jr. | 307/585 |
| 4,420,721 | 12/1983 | Dorey et al. | 324/110 |

Primary Examiner—Ernest F. Karlsen
Attorney, Agent, or Firm—Bernard E. Franz; Donald J. Singer

[57] ABSTRACT

The switch comprises a circuit from a first output terminal via parallel MOS devices in series with current-sensing resistance to a second output terminal, with alternative high-side and low-side configurations having a load between the second terminal and ground, or the first terminal and the DC supply voltage. An input terminal for a digital control signal is coupled via an input diode and two Schmitt Trigger CMOS inverters to a control lead for the gates of the switch. A current overload or short circuit protection circuit coupled between the current-sensor and the input diode comprises two transistors coupled by a diode. A built-in test circuit for indicating the switch condition (on, off, shorted or open) comprises MOS transistors having their gates connected to voltage dividers at the two output terminals, and their drains connected to discrete indication terminals.

9 Claims, 3 Drawing Figures

HIGH SIDE SWITCH

LOW SIDE SWITCH

HIGH OR LOW-SIDE STATE RELAY WITH CURRENT LIMITING AND OPERATIONAL TESTING

RIGHTS OF THE GOVERNMENT

The invention described herein may be manufactured and used by or for the Government of the United States for all governmental purposes without the payment of any royalty.

BACKGROUND OF THE INVENTION

The present invention relates generally to DC a solid state switch which can be operated as a high-side switch which applies voltage to a load, or as a low-side switch which provides a closure to ground for a load, with built-in current limiting and test features relating to the state of operation.

Solid state switches for connecting a direct-current supply to a load are well known, as shown for example by U.S. Pat. No. 3,148,357 to Thornton and No. 3,610,953 to Gordon Schade, Jr., U.S. Pat. No. 4,274,014 shows a solid state switch in the form of a complementary symmetry inverter which include current limiting. In the patent current limiting is obtained with a current mirror transistor amplifier connected in series with the inverter and switched by one of the devices of the inverter. The switched current source not only limits the peak value of the switching current pulse but also limits the current between the inverter output and an external device. U.S. Pat. No. 4,188,547 to Fox is directed to a control circuit for a power switch or high level solid state relay. The Fox relay may be used for controlling the energization of a load from a DC power supply. Schmidt, Jr. in U.S. Pat. No. 3,720,848 discloses an analog switch or transmission gate which may be used as a solid state relay. Jorgensen in U.S. Pat. No. 3,984,703 discloses a CMOS Schmidt Trigger. U.S. Pat. No. 3,789,244 to Provanzano is directed to a simple and inexpensive solid state switch which presents the same impedance pattern whether the circuit power is on or off, whether the signal at the input is in the normal range or is a substantial overvoltage, and irrespective of the polarity of the input signal.

A particular digital computer contained large numbers of electromagnetic relays. A solid state switch was needed which was efficient, required minimum printed-circuit board area, was low cost and had built in test features compatible with the digital computer.

Previous solid state switches were designed as either high-side switches or low-side switches. These were two distinctly different circuits and could not be used interchaneably.

Previous solid state switches required additional circuitry to inhibit the built-in test during a specified transient in order to prevent a false fault indication.

SUMMARY OF THE INVENTION

An object of the invention is to provide a solid switch to fulfil the above need.

The solid state switch according to the invention can be used as a DC switch for energizing relays, solenoids, lamps or resistive loads. It is capable of handling inductive or capacitive loads. It has the capability of a switch to be used in either a high-side or a low-side configuration. It also has the capability of a switch to give correct built-in test indications during a specified transient while short circuit protection remains active.

The switch according to the invention overcomes shortcomings of prior switches.
1. It is capable of being operated as either a high-side switch or a low-side switch.
2. It is short-circuit protected.
3. It will remain on during the specified transient and will not give a short-circuit indication during this transient.
4. It's dissipation under a short-circuit condition is substantially less than it is when operating with a nominal load.
5. This innovation permits the fabrication of a general purpose switch board for use in military computers (The use of power MOS devices as switch elements permits the solid state switch to be expandable to any current level without the use of any heatsink components).

DETAILED DESCRIPTION

Figure 1:
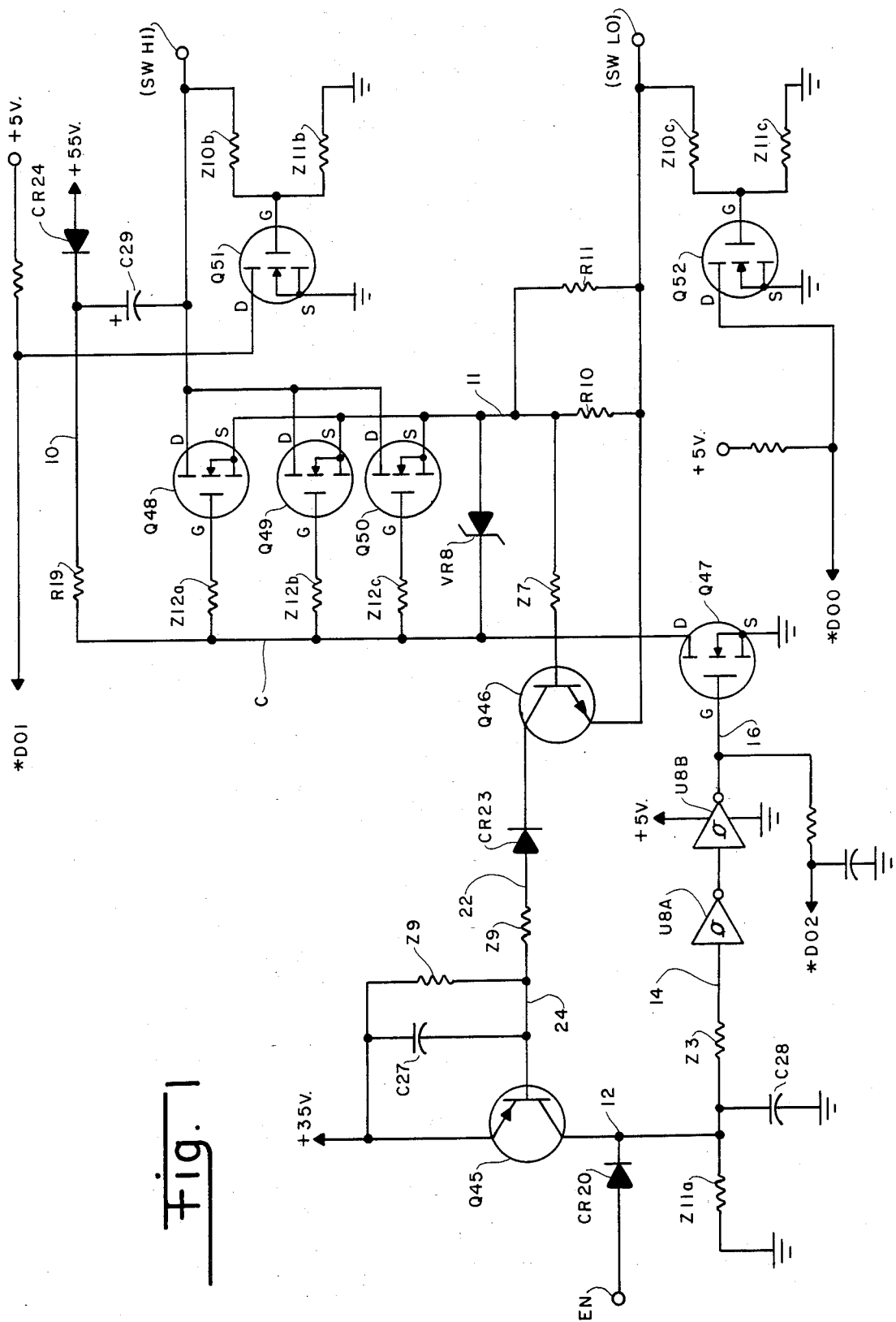
FIG. 1 is a schematic diagram of a solid state switch according to the invention.
Figure 2:
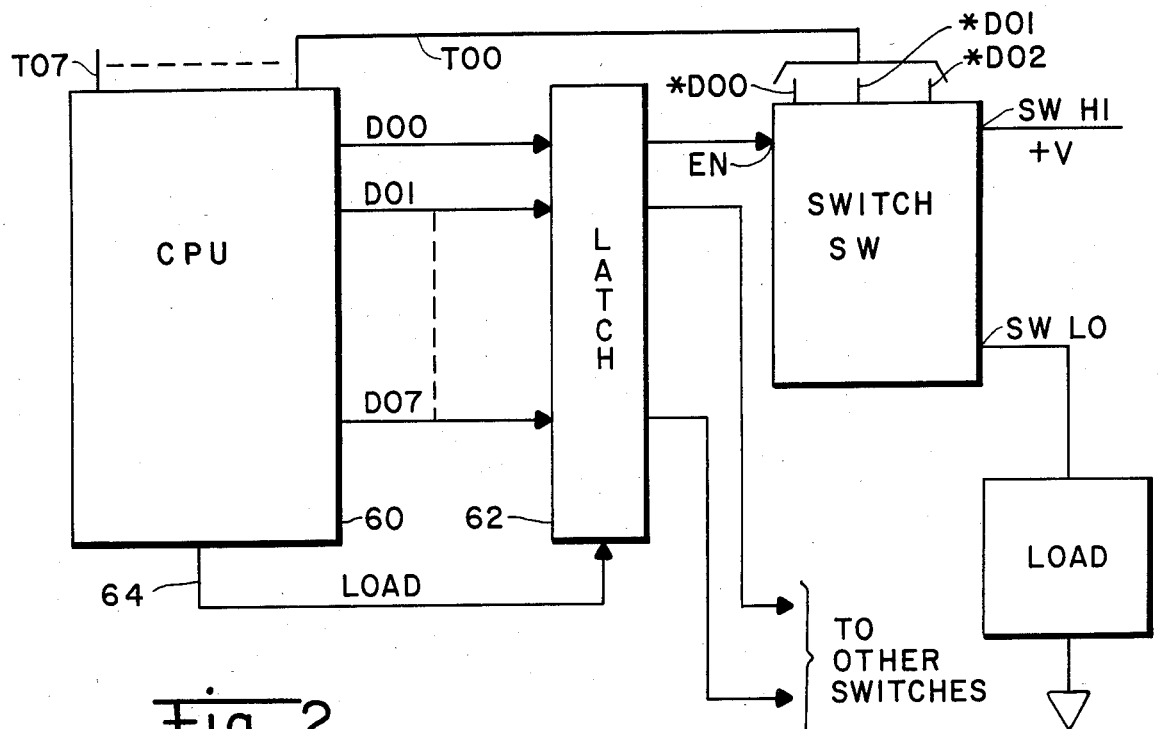
FIGS. 2 and 3 are block diagrams showing the use of the switch for high-side and low-side operation respectively.
Figure 3:
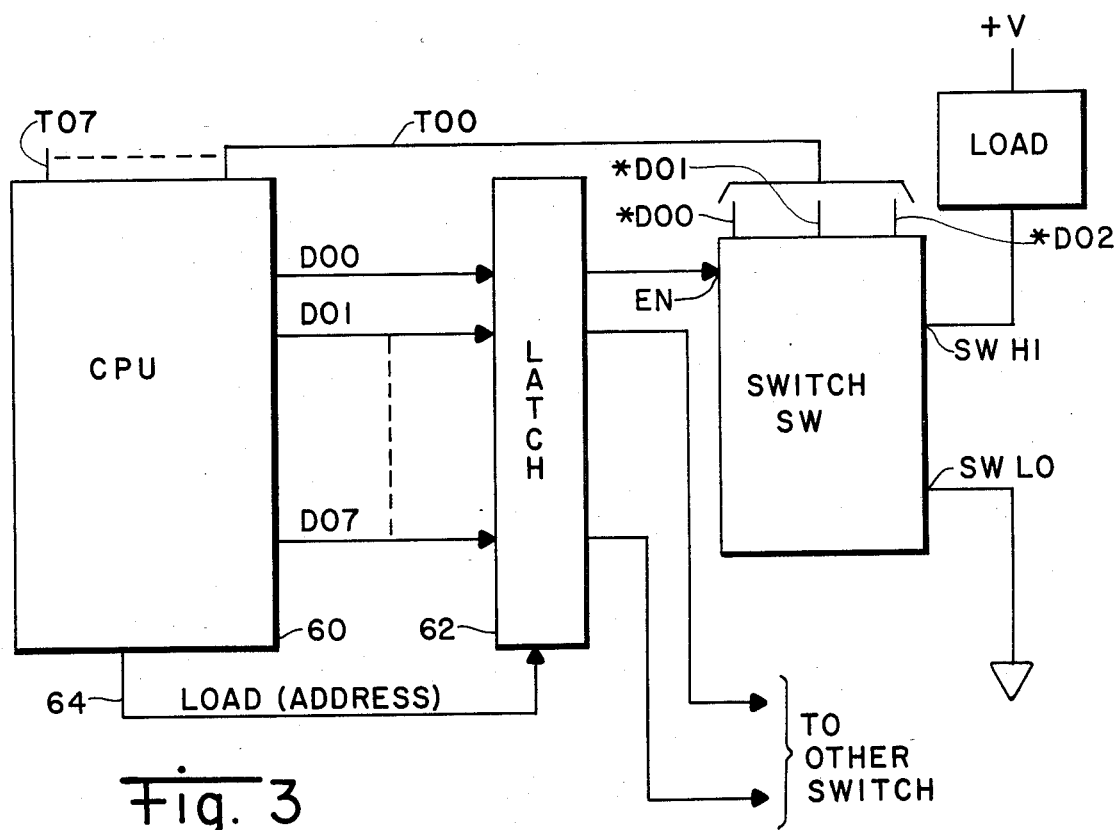

Referring to the schematic diagram FIG. 1, the solid state switch comprises three MOS transistors Q48, Q49 and Q50 in parallel in series with resistance R10–R11 between terminals SW HI and SW LO. The entire schematic of FIG. 1 comprises the switch SW shown in FIGS. 2 and 3. The switch is controlled by the central processing unit CPU of a digital computer. The switch SW may be connected in the high-side configuration with the high side of the switch at terminal SWHI connected to a positive DC supply as shown in FIG. 2, the load being connected between the low side of the switch at terminal SWLO and ground. Alternatively, the switch SW may be connected in the low side configuration with the low side of the switch at terminal SWLO connected to ground as shown in FIG. 3, the load being connected between the high side of the switch at terminal SWHI and the positive voltage supply. The switch SW is also connected to a central processing unit 10 via test leads *D00, *D01 and *D02, which are shown in FIGS. 2 and 3 as forming a line T00.

The switch SW is controlled by the central processing unit 60. As shown in both of FIGS. 2 and 3, the switch SW may be one of a group of eight which are controlled respectively via leads D00–D07, a latch unit 62, and a decoded address (load) on a lead 64. The output of the latch 62 goes to the input EN of the switch SW.

The devices Q48–Q50 (FIG. 1) may for example be type 2N6796 (Power MOS). There are 370-ohm gate resistors Z12a, Z12b and Z12c connected respectively in series with the gates of these devices to a common control lead C, in order to minimize the possibility of oscillation. A low-leakage Zener diode VR8 (12 volt) is connected between the control lead C and the sources of the FET switches at node 11. The drain terminals are connected to the high-side terminal SWHI. The current-sensing resistors R10 and R11 (each 0.187 ohms, two watts, in parallel) are connected between node 11 and the terminal SWLO. The control node C is also connected through a 56-kilohm resistor R19 to node 10. This node 10 also connects to the cathode of a diode CR24, and to a 0.56-microfarad, 100-volt capacitor C29 to form the bias supply for the FET switches, the anode of diode CR24 being connected to a 55-volt source, and capacitor C29 to the terminal SWHI.

The switch control input pin EN is coupled via a Schmitt Trigger circuit to the control node C. (Note that two Schmitt Trigger Inverters U8A and U8B such as type MC14584 are used in tandem because CMOS Schmitt Trigger Buffers are not available). The input circuit includes a diode CR20 connected from input terminal EN8 to a node 12. A 330-kilohm resistor Z11a and a 1.2-microfarad, 20-volt capacitor C28 are also connected from node 12 to ground. A 10-kilohm resistor Z3 isolates node 12 from the input of the Schmitt Trigger Inverter U8A. The output of the Schmitt Trigger Inverter U8B is connected at node 16 to the gate of a MOS transistor Q47 (type 2N6796), whose drain is connectged to the control node C, and whose source is grounded.

A current limiting circuit comprises transistor amplifiers Q46 (type JANTX 2N3700) and Q45 (type JANTX 2N2907A). Transistor Q46 has its base connected through a 120-ohm resistor Z7 to node 11, its collector connected through a diode CR23 to a node 22, and its emitter connected to terminal SWLO. Transistor Q45 has its base connected to a node 24, its collector connected to node 12, and its emitter connected to a +35-volt direct-current bias supply. A 2-kilohm resistor Z9 and a 0.1-microfarad capacitor C27 are connected in parallel across the emitter-base junction of transistor Q45.

Test circuits to leads *D01 and *D00 include MOS transistors Q51 and Q52 (both type 3N171). These test leads are connected to respective 10-kilohm pull-up resistors to a +5-volt bias supply, and also respectively to the drains of devices Q51 and Q52. The gate of the device Q51 is connected to a bias network comprised of a one-megohm resistor Z10b and a 330-kilohm resistgor Z11b. Resistor Z10b connects the gate of device Q51 to terminal SWHI; resistor Z11b connects the gate of device Q51 to ground. The gate of device Q52 is similarly biased, the gate being connected to terminal SWLO through a one-megohm resistor and to ground through a 330-kilohm resistor Z11c. The sources of devices Q51 and Q52 are grounded. An optional test lead *DO2 is connected via a resistor to node 16. This test lead is filtered by a capacitor to ground.

In the system, a logical 1 is a positive voltage level near 5 volts, and a logical 0 is a potential near ground.

OPERATION

The switch is energized when a logical 0 is applied from terminal EN to the cathode of diode CR20. This causes the input of the CMOS Schmitt Trigger inverter U8A to decay to a logical 0 and its output becomes a logical 1—thus the output of device U8B is a logical 0. Since the FET Q47 is a MOS device, the input impedance is high and the voltage at its gate is actually less than 50 millivolts. Thus FET Q47 is off and the switches Q48, Q49, and Q50 are turned on by the +55-volt gate bias voltage supply.

The Zener diode VR8 limits the gate-to-source voltage to a value within the rating of the devices Q48, Q49, and Q50.

In the high-side switch configuration (see FIG. 2), the load is connected between terminal SWLO and ground. The gate-to-source voltage for the switches Q48–Q50 is controlled by the breakdown voltage of Zener diode VR8. During an 80-volt transient as prescribed by a military standard MIL 704, the input voltage which is applied to terminal SWHI and is normally 22 to 32 volts, surges to 80 volts for 100 milliseconds. During this time capacitor C29 retains enough charge to maintain the switch gate-to-source voltage and the switch remains on.

The switch operation in a low-side switch configuratioin (see FIG. 3) is identical to that described for a high-side switch.

The load current is sensed by resistors R10 and R11. When the current exceeds a prdetermined level the emitter-base junction of transistor Q46 is forward biased and transistor Q46 turns on. This turns on transistor Q45 which charges capacitor C28 until a logical 1 is detected at the input of device U8A. The output of device U8A goes to a logical 0 and the output of device U8B to a logical 1, which turns on transistor Q47 and turns off transistors Q48–Q50. These devices remain off until capacitor C28 discharges through resistor Z11a. Thus it can be seen that on/off duty cycle under overload or short circuit conditions can be controlled by resistor Z11a and capacitor C28 and the hysteresis of the Schmitt Trigger.

During an 80-volt transient the load current increases by a factor of approximately 3. In a high-side configuration the output voltage of the switch is 80 volts. Diode CR23 blocks the voltage and prevents the breakdown of transistors Q45 and Q46, both of these transistors are off, and normal operation of the switch continues. The switch described has a rating of 5 amperes. For lower current ratings transistor Q49 and/or Q50 and their base resistors may be omitted.

Built-in test.

The circuit comprised of resistor Z10c, Z11c, and transistor Q52 form a voltage detector with a threshold of 6 volts. This threshold is controlled by the gate-to-source threshold of transistor Q52 and the gain of the network Z10c, Z11c. In a high-side configuration when the switch is on the potential at the terminal SWLO is 28 volts (for a 28-volt system) and $V_{GS}$ of transistor Q52 is approximately 7 volts. This turns on transistor Q52 and provides a logical 0 at the terminal labeled *D00. This discrete is read by the computer to determine whether the switch is on, off, or shorted. The network comprised of resistors Z10b, Z11b and transistor Q51 function in the same manner as that described for the network Z10c, Z11c, Q52. The network Z10b, Z11b, Q51 tells the CPU whether the input voltage to the switch is present.

In a low-side switch configuration the feedback at terminal *D00 is normally a logical 1 unless there is no continuity between terminal SWLO and ground. In this configuration the discrete *D01 provides the feedback to the CPU as to whether this switch is on, off or shorted.

Table I gives the condition of the discretes *D00 and *D01 for various load and switch conditions.

TABLE I

| EN8 (Switch Command Discrete) | *D00 | *D01 | Switch Configuration | Switch Condition |
|---|---|---|---|---|
| 1 | 0 | 1 | High Side | Off |

TABLE I-continued

| EN8 (Switch Command Discrete) | *D00 | *D01 | Switch Configuration | Switch Condition |
|---|---|---|---|---|
| 1 | 1 | 1 | High Side | Excitation Missing |
| 1 | 0 | 0 | High Side | Shorted |
| 0 | 1 | 0 | High Side | Open (or load shorted) |
| 0 | 0 | 0 | High Side | On (normal) |
| 1 | 1 | 0 | Low Side | Off |
| 0 | 1 | 1 | Low Side | On |
| 1 | 1 | 1 | Low Side | Shorted |
| 0 | 1 | 0 | Low Side | Open (or load shorted) |

The optional feedback *DO2 can be used to resolve the ambiguity between open switch and shorted load. Under a shorted load condition the output of device U8B is high with a duty cycle of 98%. This can be easily filtered and used by the CPU whenever the switch command discrete is a 0. If the switch is open, the discrete *D02 will be a logical 0. If the load is shorted, the discrete will be a logical 1.

The present invention, as hereinabove described, therefore provides a novel DC solid state switch which can be operated as a high-side switch which applies voltage to a load, or as a low-side switch which provides a closure to ground for a load, with built-in current limiting and test features relating to the state of operation. It is understood that certain modifications to the invention as described may be made, as might occur to one with skill in the field of this invention, within the intended scope of the appended claims. Therefore, all embodiments contemplated hereunder which achieve the objectives of the invention have not been shown in complete detail. Other embodiments may be developed without departing from the spirit of this invention or from the scope of the appended claims. "Ground" refers to a common conductor, which is not necessarily an actual earth connection.

I claim:

1. A solid state relay having a high-side terminal and a low-side terminal for use in series with a load between a positive pole and a negative pole of a direct-current power supply, the negative pole being ground, the solid state relay being adapted for use either as a high-side switch in a configuration in which the high-side terminal is connected directly to said positive pole and the load is connected between the low-side terminal and ground, or as a low-side switch in a configuration in which the the load is connected between said positive pole and the high-side terminal with the low-side terminal connected directly to ground;

wherein said solid state relay comprises:

solid state switch means connected in series with current detection means between said high-side and low-side terminals, the solid state switch means having a control terminal for turning it on or off, on being a low-impedance state and off being a high-impedance state;

input means including Schmitt Trigger means coupled between an input terminal and said control terminal, responsive to first and second digital logic signals at the input terminal respectively to control a potential level at the control terminal for turning the solid state switch means on or off, bias means connected to the control terminal;

overload protection means coupled between said current detection means and said Schmitt Trigger means, including amplifying means and integrating means, for turning off the solid state device means in response to exceeding predetermined conditions of current and time; and first test means having an input coupled to the high-side terminal and an output to a first indication terminal, and second test means having an input coupled to the low-side terminal and an output to a second indication terminal, for detecting given switch conditions and providing digital output indications.

2. A solid state relay according to claim 1, which includes means to cause the solid state switch means to remain on during during a predefined transient condition, without said test means producing a false fault indication.

3. A solid state relay according to claim 2, wherein said direct-current power supply normally provides 22 to 32 volts, and the predefined transient condition is a surge to 80 volts for 100 milliseconds, wherein said bias means comprises a diode having an anode and a cathode, with the anode connected to a positive 55-volt source, a resistor connected from the cathode to said control terminal, and a capacitor connected from the cathode to said high-side terminal, with the capacitor retaining enough charge during the transient condition to maintain the required bias at the control terminal for the solid state switch means to remain on; wherein the overload protection means includes a diode connected to block the transient voltage and thereby ensure that the solid state switch means remains on, with normal operation continuing after the transient condition.

4. A solid state relay according to claim 2, wherein said first test means and second test means each comprise a voltage divider comprising two resistors in series coupled between its input and ground, an MOS device having gate, drain and source electrodes, with the gate electrode connected to the junction of the two resistors of the voltage divider, the drain electrode connected to its output and also via a load resistor to a bias source, and the source electrode grounded;

wherein the signals at the indication terminals are discrete logic levels designated as 1 or 0, so that giving the bits in order for the second and first indication terminals, the test indications are for a high-side configuration 01 off, 11 excitation missing, 00 shorted, 10 open or load shorted, and 00 on; and for a low-side configuration 10 off, 11 on, 11 shorted, 10 open or load shorted.

5. A solid state relay according to claim 4, further including third test means with filter means having an input coupled to coupled to the output of said Schmitt Trigger means and an output coupled to a third indication terminal, the third test means being used to resolve the ambiguity between open switch and shorted load, with a logical 0 indicating that the switch is open, and a logical 1 indicating that the load is shorted.

6. A solid state relay according to claim 5, wherein the Schmitt Trigger means comprises CMOS devices, wherein the current detection means comprises resistance means connected between said solid state switch means and the low-side terminal, and wherein said overload protection means comprises a transistor having an input circuit coupled across the current detection means and on output electrode coupled via an overload-circuit diode and resistor to an input of another transistor, which in turn has an output electrode coupled to an input junction point, said input terminal being connected via an input diode to said input junction point, the input junction point being also connected via a resistor and capacitor in parallel to ground, and via a resistor to the input of the Schmitt Trigger means, so that on/off duty cycle under overload or short circuit condition can be controlled by the resistor and capacitor at the input junction point and the hysteresis of the Schmitt Trigger; wherein the design is such that a predetermined transient condition, in a high-side configuration, is blocked by said overload-circuit diode which prevents turning on the amplifying devices of the overload protection means to permit normal operation of the relay to continue.

7. A solid state relay according to claim 6, wherein the transistors of the overload protection means comprise bipolar transistors each having emitter, base and collector electrodes, in common emitter configurations, the collector electrodes being the output electrodes, said another transistor having a resistor and capacitor in parallel between the base and emitter electrodes, with the emitter electrode connected to a bias voltage source;

wherein said input means includes an MOS device having a gate electrode connected to the output of the Schmitt Trigger means, a drain electrode connected to said control lead, and a source electrode connected to ground;

wherein said solid state switch means comprises a plurality of MOS devices in parallel, having drain electrodes connected to the high-side terminal, source electrodes connected to the current detection means, and gate electrodes connected via respective resistors to said control terminal, with a Zener diode connected between the control terminal and the source electrodes to limit the gate-to-source voltage to a value within the rating of said solid state device means;

the control terminal being connected via a resistor and diode in series to a bias voltage source, with the junction of the last said resistor and diode connected via a capacitor to the drain electrodes, so that during said predetermined transient condition the last said capacitor retains enough charge to maintain the switch gate-to-source voltage and the relay remains on.

8. A solid state relay according to claim 1, wherein the solid state switch means comprises a plurality of MOS power devices in parallel;

wherein the Schmitt Trigger means comprises CMOS devices, wherein the current detection means comprises resistance means connected between said solid state switch means and the low-side terminal;

wherein said overloaded protection means comprises a transistor having an input circuit coupled across the current detection means and an output electrode coupled via an overload-circuit diode and resistor to an input of another transistor, which in turn has an output electrode coupled to an input junction point, said input terminal being connected via an input diode to said input junction point, the input junction point being also connected via a resistor and capacitor in parallel to ground, and via a resistor to the input of the Schmitt Trigger means, so that on/off duty cycle under overload or short circuit condition can be controlled by the resistor and capacitor at the input junction point and by the hysteresis of the Schmitt Trigger.

9. A solid state relay according to claim 8, wherein the design is such that a given voltage transient, in a high-side configuration, is blocked by said overload-circuit diode which prevents turning on the transistors of the overload protection means to permit normal operation of the relay to continue;

the control terminal being connected via a resistor and diode in series to a bias voltage source, with the junction of the last said resistor and diode connected via a capacitor to the high-side terminal, so that during said given voltage transient the last said capacitor retains enough charge to maintain the switch gate-to-source voltage and the relay remains on.

* * * * *